United States Patent
Mita et al.

[11] Patent Number: 6,051,371
[45] Date of Patent: Apr. 18, 2000

[54] METHOD FOR BAKING PHOTORESIST APPLIED ON SUBSTRATE

[75] Inventors: Katsuhisa Mita, Tokyo; Yasuo Matsuoka, Kawasaki; Kenichi Taniyama, Yokohama; Michirou Takano, Kawasaki; Tsuneo Akasaki; Kaoru Kanda, both of Yokohama, all of Japan

[73] Assignee: Kabushiki Kaisha Toshiba, Kawasaki, Japan

[21] Appl. No.: 09/119,959

[22] Filed: Jul. 21, 1998

Related U.S. Application Data

[62] Division of application No. 08/654,885, May 29, 1996, Pat. No. 5,817,178.

[30] Foreign Application Priority Data

May 30, 1995 [JP] Japan ................................. 7-132193
May 14, 1996 [JP] Japan ................................. 8-119108

[51] Int. Cl.$^7$ ............................................. G03F 7/00
[52] U.S. Cl. ............................... 430/330; 427/372.2
[58] Field of Search ................... 430/330; 427/372.2

[56] References Cited

U.S. PATENT DOCUMENTS

| | | | |
|---|---|---|---|
| 4,832,781 | 5/1989 | Mears ........................................ | 118/724 |
| 4,863,547 | 9/1989 | Shidahara ................................. | 156/345 |
| 4,886,571 | 12/1989 | Suzuki et al. ............................ | 118/724 |
| 4,981,103 | 1/1991 | Sekiguchi et al. ....................... | 118/725 |
| 5,051,338 | 9/1991 | Kato ......................................... | 430/296 |
| 5,240,505 | 8/1993 | Iwasaki et al. .......................... | 118/724 |
| 5,314,541 | 5/1994 | Saito et al. ............................... | 118/724 |
| 5,344,492 | 9/1994 | Sato et al. ................................ | 118/725 |
| 5,372,648 | 12/1994 | Yamamoto et al. ..................... | 118/725 |
| 5,462,014 | 10/1995 | Awaya et al. ............................ | 118/725 |
| 5,462,603 | 10/1995 | Murakami ................................ | 118/725 |
| 5,487,786 | 1/1996 | Childa et al. ............................ | 118/724 |

FOREIGN PATENT DOCUMENTS

| | | |
|---|---|---|
| 60-263431 | 12/1985 | Japan . |
| 61-235835 | 10/1986 | Japan . |
| 6-216020 | 8/1994 | Japan . |
| 7-152158 | 6/1995 | Japan . |
| 7-153678 | 6/1995 | Japan . |
| 7-211628 | 8/1995 | Japan . |
| 7-281453 | 10/1995 | Japan . |

*Primary Examiner*—Kathleen Duda
*Assistant Examiner*—Nicole Barreca
*Attorney, Agent, or Firm*—Finnegan, Henderson, Farabow, Garrett & Dunner, L.L.P.

[57] ABSTRACT

A photomask substrate, which is formed in a rectangular shape and on the surface of which photoresist is applied, is located above a lower heating plate so as to be separated from the lower heating plate by a proximity distance. The lower heating plate is provided with a heat unifying ring fixedly arranged thereon so as to surround the photomask substrate. The periphery of the heat unifying ring is provided with a taper section tapered at a predetermined angle to the periphery. The heat unifying ring has a container for containing the photomask substrate, at the central portion. An upper heating plate is arranged above the lower heating plate. The upper heating plate is provided with a baking chamber thereabove to cover the entire portion of the baking chamber section, thereby the baking chamber section can be shielded from the outside and free from the influence of the outside.

14 Claims, 9 Drawing Sheets

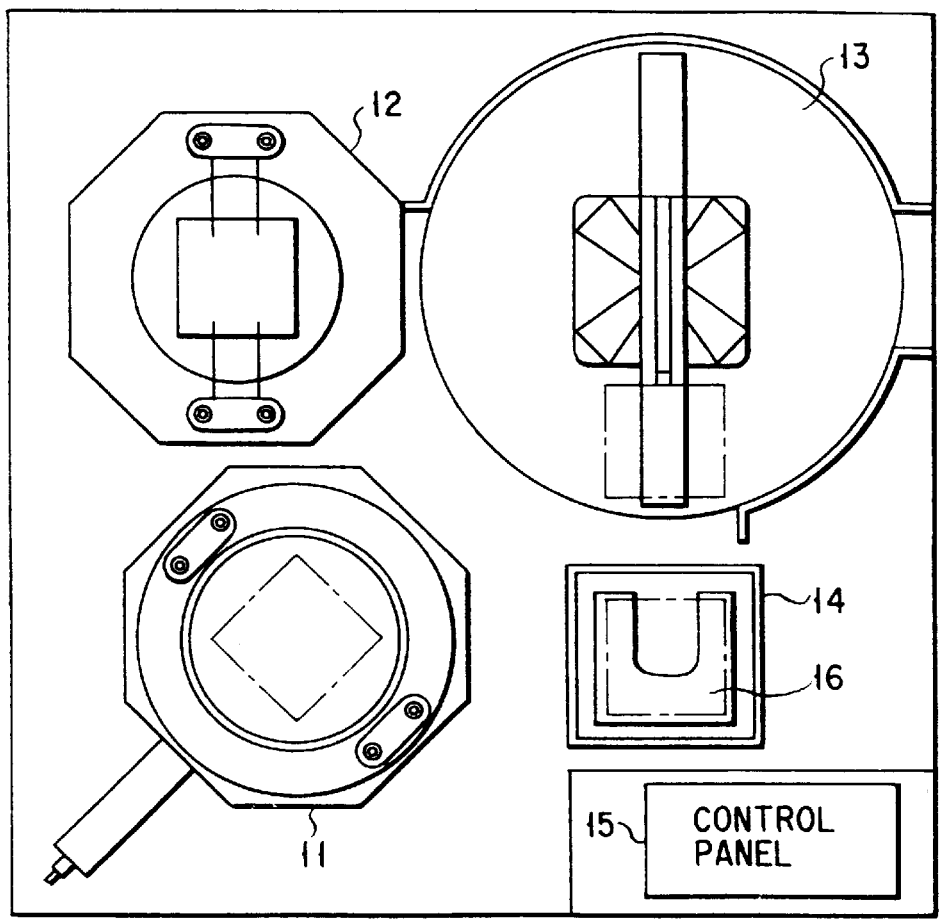
F I G. 2

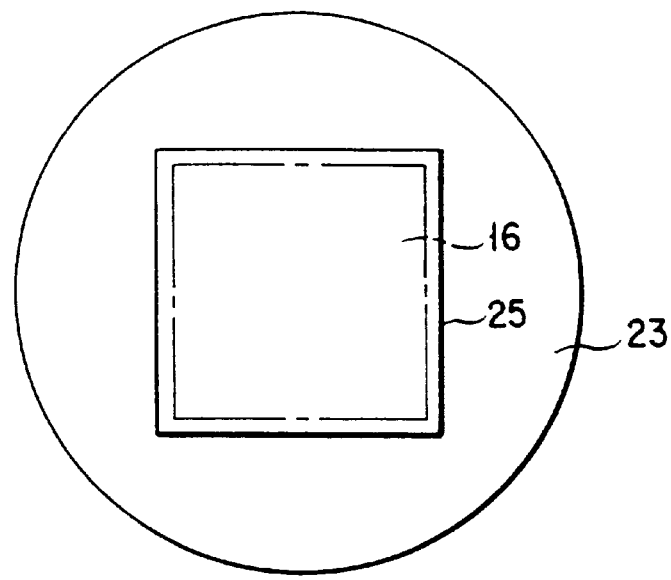
F I G. 5
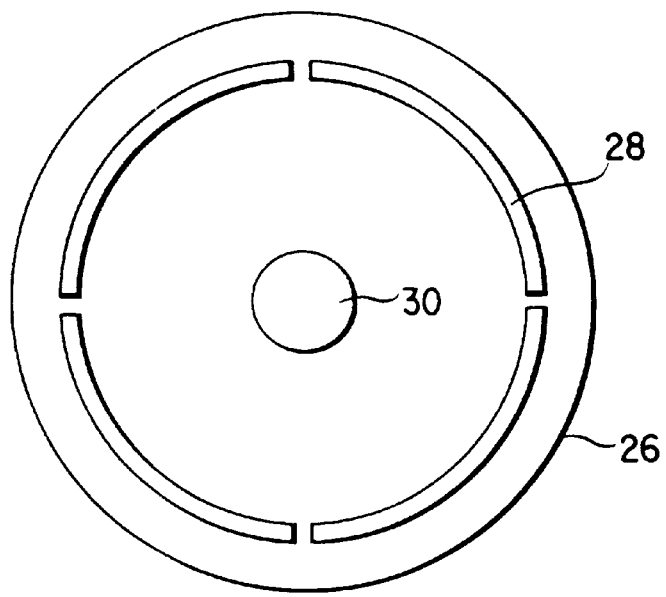
F I G. 6

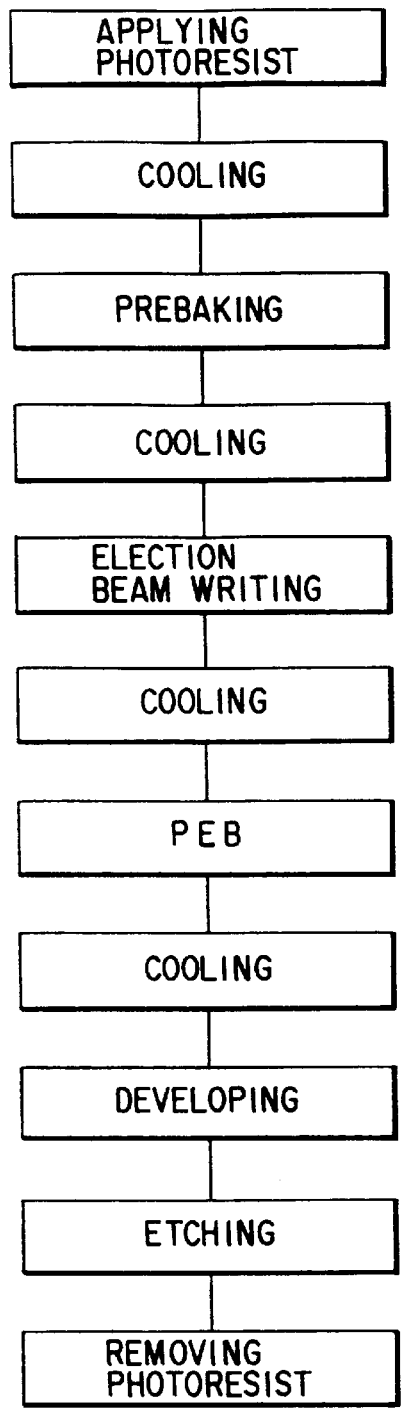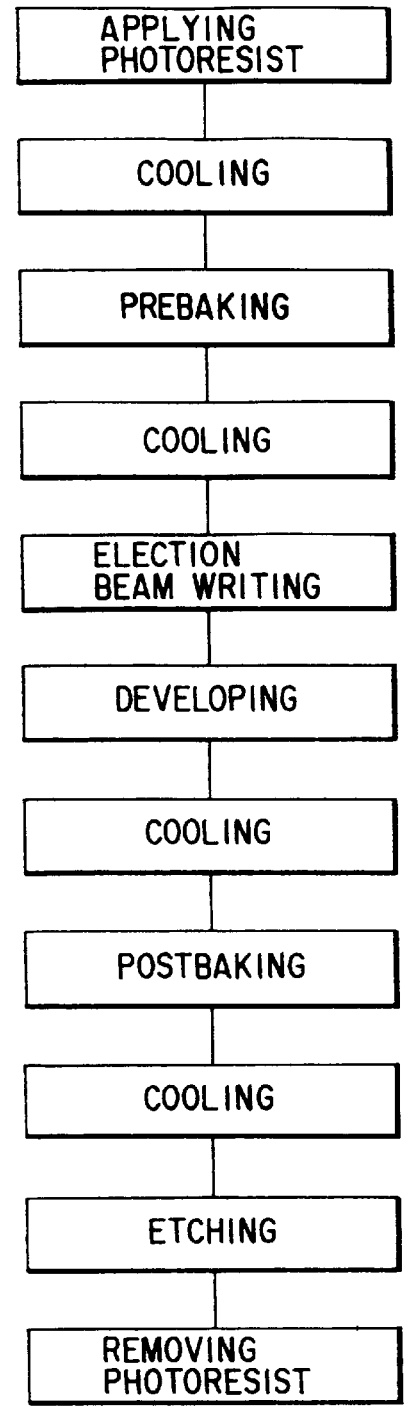
F I G. 7A    F I G. 7B

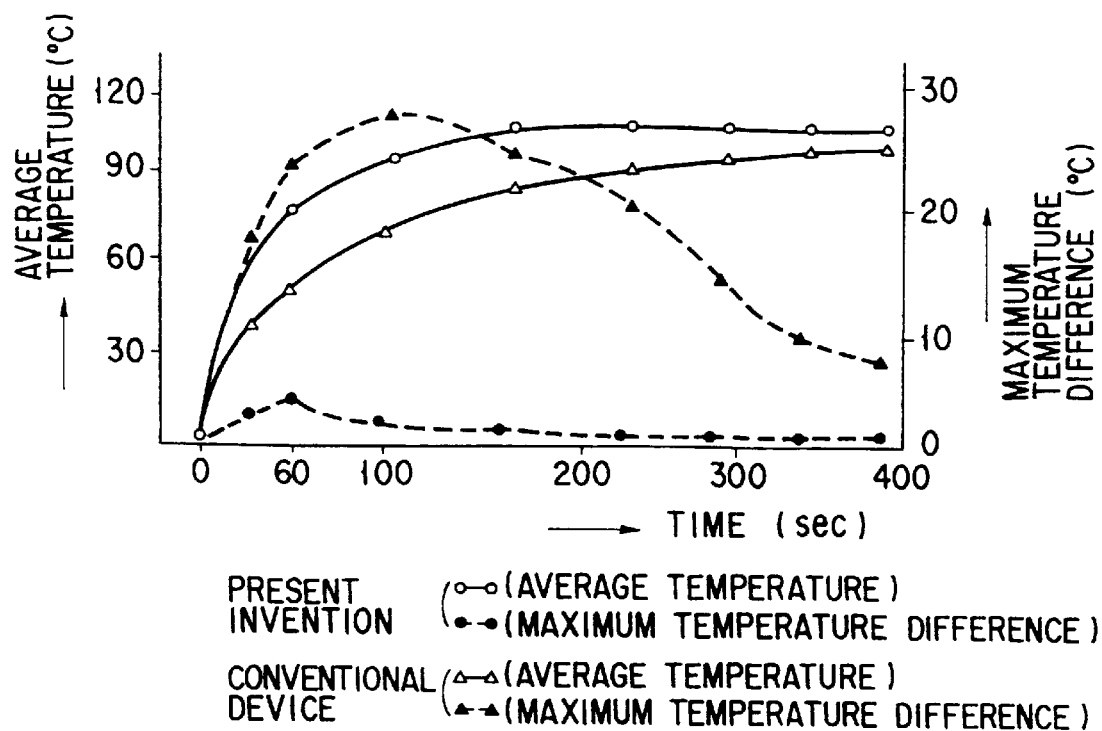
F I G. 8
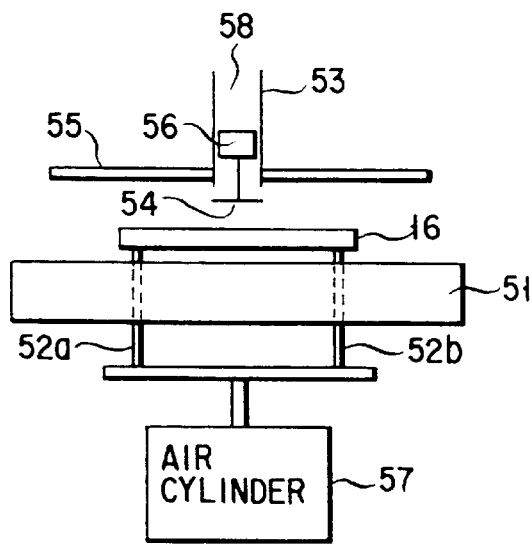
F I G. 9

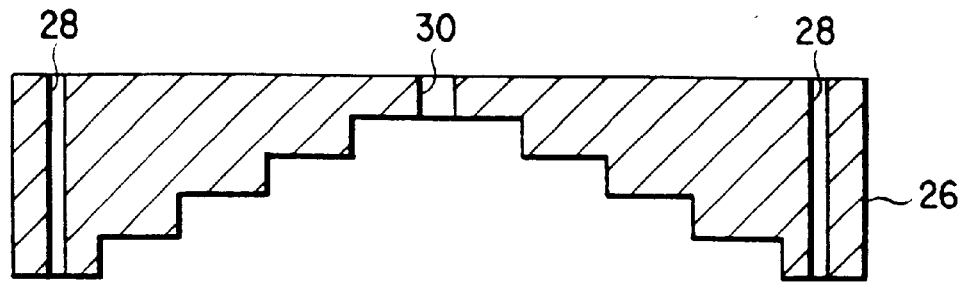
F I G. 10A
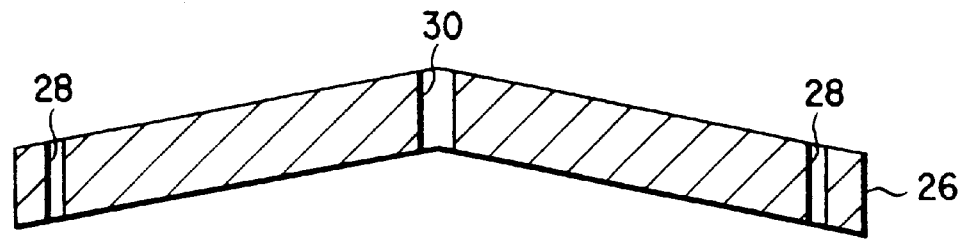
F I G. 10B
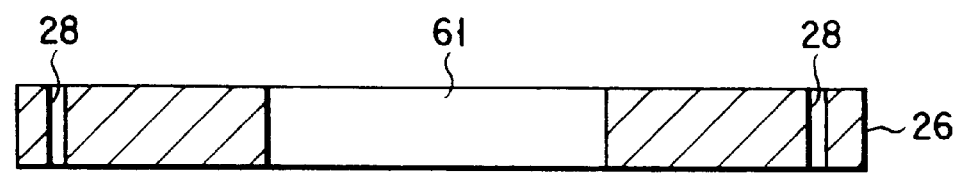
F I G. 10C
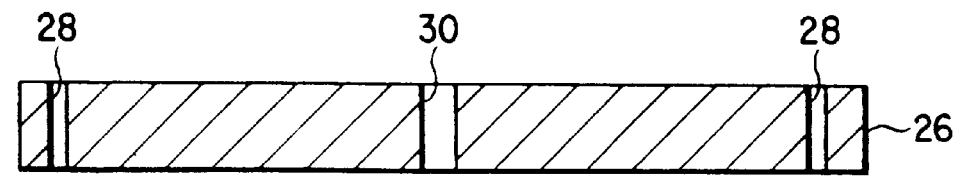
F I G. 10D

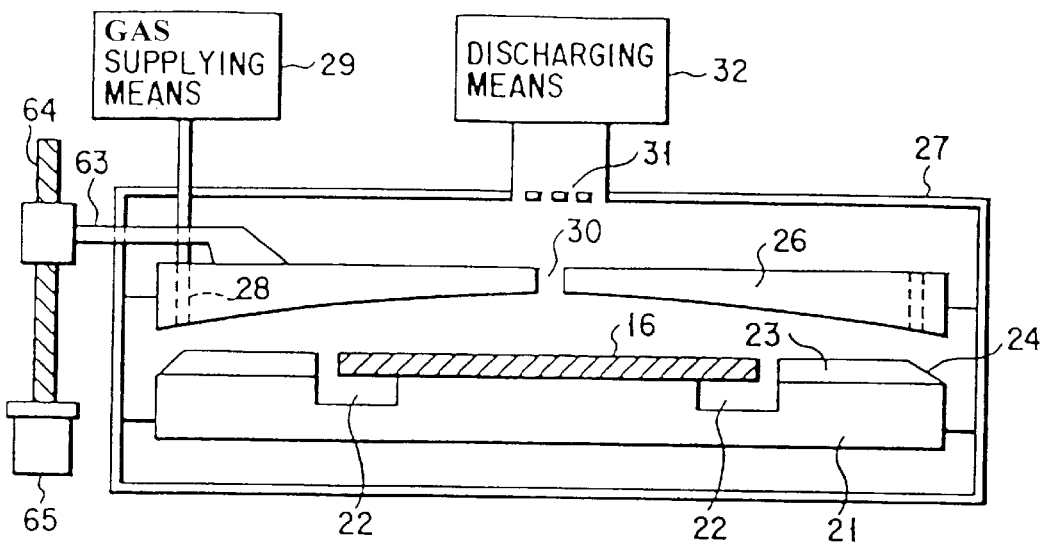
F I G. 13
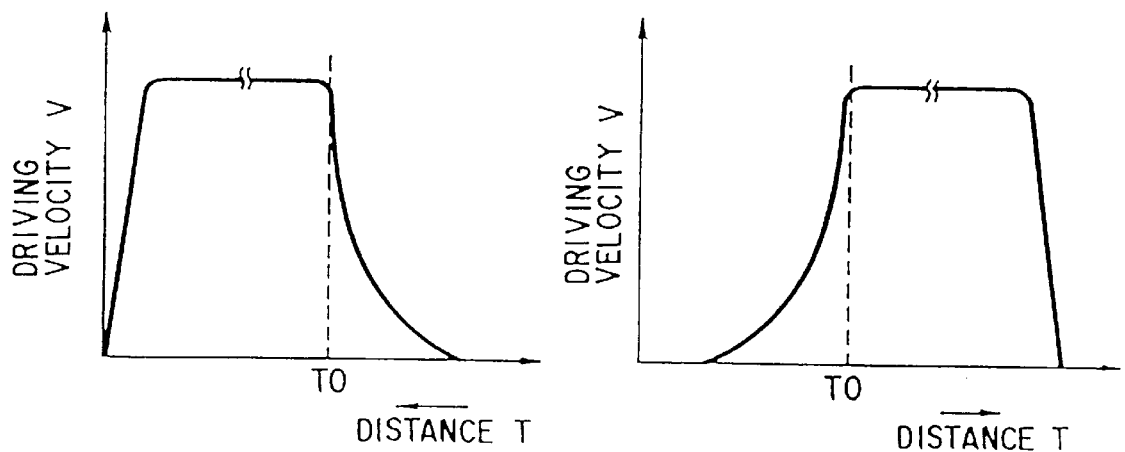
F I G. 14A
F I G. 14B

METHOD FOR BAKING PHOTORESIST APPLIED ON SUBSTRATE

This is a division of application Ser. No. 08/654,885, now U.S. Pat. No. 5,817,178 filed May. 29, 1996, which is incorporated herein by reference.

BACKGROUND OF THE INVENTION

1. Field of the Invention

This invention relates to an apparatus and a method of performing a baking step in the photolithographic processes on a semiconductor substrate, a substrate of a liquid crystal display, and a substrate of photomask used for forming these substrates when the substrates are formed.

2. Description of the Related Art

The photomask used in semiconductor devices is obtained by a series of steps: forming of a thin film of metal such as Cr by use of the sputtering deposition; applying of a photoresist thereon; prebaking; writing of a pattern with an electron beam, writing apparatus; developing of the photoresist; postbaking; performing of a selective-etching of the thin metal film; and removing of the photoresist.

In the conventional photolithography, the resolution or size uniformity of pattern on the surface of the substrate is not required so strictly. In addition, the characteristics of the photoresist used in the photolithograpy do not much depend on the uneven distribution of heat applied to the photoresist in the baking process.

The conventional baking apparatus for baking a photoresist will be more specifically described below, in conjunction with the sectional view shown in FIG. 1. As shown in the drawing, the conventional baking apparatus has only one heating plate, i.e., heating plate 71. A substrate 72 made of material such as quartz and coated with photoresist is located above the heating plate 71 so as to be separated therefrom by a proximity gap of several microns. The photoresist is baked for a predetermined period of time. The proximity gap is provided by a sealing member 73 between the substrate and the heating plate. As can be understood from this structure, the substrate 72 is placed in an open space while the photoresist is being baked in the conventional baking apparatus. The substrate is removed from the heating plate 71 so that the photoresist may be cooled at room temperature.

In recent years, as the semiconductor device is decreased in size, higher resolution and higher size uniformity are required of the pattern on the substrate. Simultaneously, a chemical amplification electron-beam resist which can serve to provide a high-resolution pattern is put into practical use. SAL 601, SAL 603, SAL 605 developed by Shipley Co., are the most popular products of this type. Phenomenons such as crosslinking reaction (in the negative type photoresist) and decomposing reaction (in the positive type photoresist) are known to occur in this type of photoresist. As generally known, these reactions greatly influence the size of the resist pattern during the heating step in the baking process. In order to prevent the influence of these reactions in the chemical amplification electron-beam resist, the baking apparatus capable of attaining the high size uniformity of the pattern is required.

However, in the conventional baking apparatus, the heating plate is directly influenced by the ambient air flows and the heat source. A large difference in temperature occurs in the surface of the heating plate, i.e., between the central portion and the peripheral portion. When a 6 inch mask (a quartz substrate of a size of 152.4×152.4×6.4 [mm]) is subjected to the baking step at 120° C., for example, the maximum temperature difference in the substrate is no less than 29.0° C. at the transition time the baking temperature is increasing (in this case, when the baking temperature is 63° C.). At the climax time the temperature stably remains at 109° C., the maximum temperature difference is 7.9° C. As is clear from this, the maximum temperature difference in the substrate surface by use of the conventional baking apparatus is considerably large both at the climax and during the temperature transition.

A chemical amplification electron beam resist is generally baked at approximately 100° C. to have its sensitivity amplified. At such a temperature, the sizes of the pattern will greatly change due to the temperature difference in the surface of the substrate. The difference in the pattern size will greatly increase after the steps following the baking step (i.e., the developing of the photoresist, selective etching of the thin metal film, and removing of the photoresist) are performed. The resultant substrate submitted to such a process does not satisfy the manufacturing criteria, of course. This is thus critical problem to be solved urgently.

Some conventional baking process is performed without providing the aforementioned proximity gap between the heating plate and the substrate. In this case, the maximum temperature difference increases more.

Further, since the heating plate of the conventional baking apparatus is exposed to the outside, as shown in the drawing, and dust may stick to the photoresist during the baking process. This structure of the conventional baking apparatus is thus also one of the causes of degradation of the photomask.

As described above, with the conventional baking apparatus, the maximum temperature difference in the substrate surface increases during the baking step, and the pattern size of the photomask (final product) greatly differs from the designed one.

SUMMARY OF THE INVENTION

The present invention thus designs to provide the apparatus for baking photoresist applied on a surface of a substrate, comprising a first heating plate for heating the substrate, the substrate is located on the first heating plate so as to directly contact the first heating plate or to be separated therefrom by a proximity gap of several microns; a second heating plate located above the substrate surface for heating the substrate; a heat unifying plate arranged on the first heating plate so as to surround the substrate; and a container containing the first and second heating plates and the heat unifying plate.

The present invention further designs to provide the apparatus for baking photoresist applied on a surface of a substrate, comprising a first heating plate for heating the substrate, the substrate is located on the first heating plate so as to directly contact the first heating plate or to be separated therefrom by a proximity gap of several microns; a second heating plate located above a substrate surface on which the photoresist is applied for heating the substrate; a heat unifying plate arranged on the first heating plate so as to surround the substrate; moving means for moving the second heating plate in a direction in which the second heating plate approaches the first heating plate when the substrate is subjected to the baking step; and a container containing the first and second heating plates and the heat unifying plate.

The present invention still further provides the apparatus for baking photoresist applied on a surface of a substrate, comprising a first heating plate for heating the substrate, the substrate is located on the first heating plate so as to directly contact the first heating plate or to be separated therefrom by a proximity gap of several microns; a second heating plate for heating the substrate, which is located above the substrate surface on which the photoresist is applied, and arranged such that the lower surface of the second heating plate approximates to the peripheral portion of the substrate; a heat unifying plate arranged on the first heating plate so as to surround the substrate; a container containing the first and second heating plates and the heat unifying plate; and a cooling plate for cooling the substrate.

The present invention also provides the method of baking photoresist applied on a surface of a substrate, comprising the steps of unifying the temperature of the substrate, by cooling the substrate before the substrate is subjected to the following baking step; baking the photoresist applied on the substrate in a container, the substrate is arranged on the first heating plate, and the periphery of the substrate is surrounded by a heat unifying plate on the first heating plate, and a second heating plate is arranged above the surface of the substrate; and cooling on a cooling plate the substrate subjected to the baking step by discharging cooling gas from the above of the substrate.

The present invention additionally provides the method of baking photoresist applied on a surface of a substrate, comprising the steps of baking in a container the photoresist applied on the substrate, the substrate is arranged on the first heating plate, the periphery of the substrate is surrounded by a heat unifying plate on the first heating plate, and a second heating plate is arranged above the surface of substrate; and moving the second heating plate in a direction away from the first heating plate after the substrate is subjected to the baking step.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a top view of the entire structure of the baking apparatus of the present invention used for baking a photomask substrate;

FIG. 5 is a top view of a heat unifying ring in the baking chamber section shown in FIG. 3;

FIG. 6 is a top view of an upper heating plate in the baking chamber section shown in FIG. 3;

FIG. 7A is the photolithography process using the chemical amplification resist;

FIG. 7B is the photolithography process using the non-chemical amplification resist;

FIG. 8 is a graph showing the average temperatures and the maximum temperature differences in the conventional apparatus and the apparatus according to the present invention at the transition time when the baking temperature is increasing.

FIG. 9 is a side view specifically illustrating the structure of a cooling section of the baking apparatus shown in FIG. 2;

FIG. 10A is a sectional view of the first modification of the upper heating plate;

FIG. 10B is a sectional view of the second modification of the upper heating plate;

FIG. 10C is a sectional view of the third modification of the upper heating plate;

FIG. 10D is a sectional view of the fourth modification of the upper heating plate;

FIG. 13 is a sectional view specifically illustrating the structure of the baking chamber section according to the second embodiment of the present invention;

FIG. 14A is a graph of the descending speed of the heating plate in the baking chamber section shown in FIG. 13;

FIG. 14B is a graph of the ascending speed of the heating plate in the baking chamber section shown in FIG. 13;

DETAILED DESCRIPTION OF THE PREFERRED EMBODIMENTS

Figure 1:
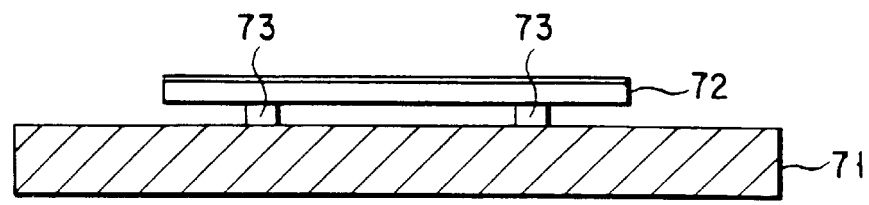
FIG. 1 is a sectional view of the conventional baking apparatus.

The present invention will be described below in conjunction with the drawings.

As shown in FIG. 2, the baking apparatus according to the present invention comprises baking chamber section 11, cooling section 12, carrying section 13, substrate carrier 14 and control panel 15.

In this structure, when the command is sent from the control panel 15, a photomask substrates 16 contained in the substrate carrier 14 are picked out by the carrying section 13 one by one, and carried to the cooling section 12 or the baking chamber section 11 so as to be cooled or subjected to the baking step. The photomask substrate 16 which have been subjected to all steps in the baking process is carried back to the substrate carrier 14 by the carrying section 13 and contained therein.

In this baking apparatus, these steps of the baking process (i.e., picking out from the substrate carrier 14, cooling, baking, cooling and containing the photomask substrate 16 in the substrate carrier 14) are serially and automatically performed in accordance with the input program when the control command is sent from the control panel 15.

Figure 3:
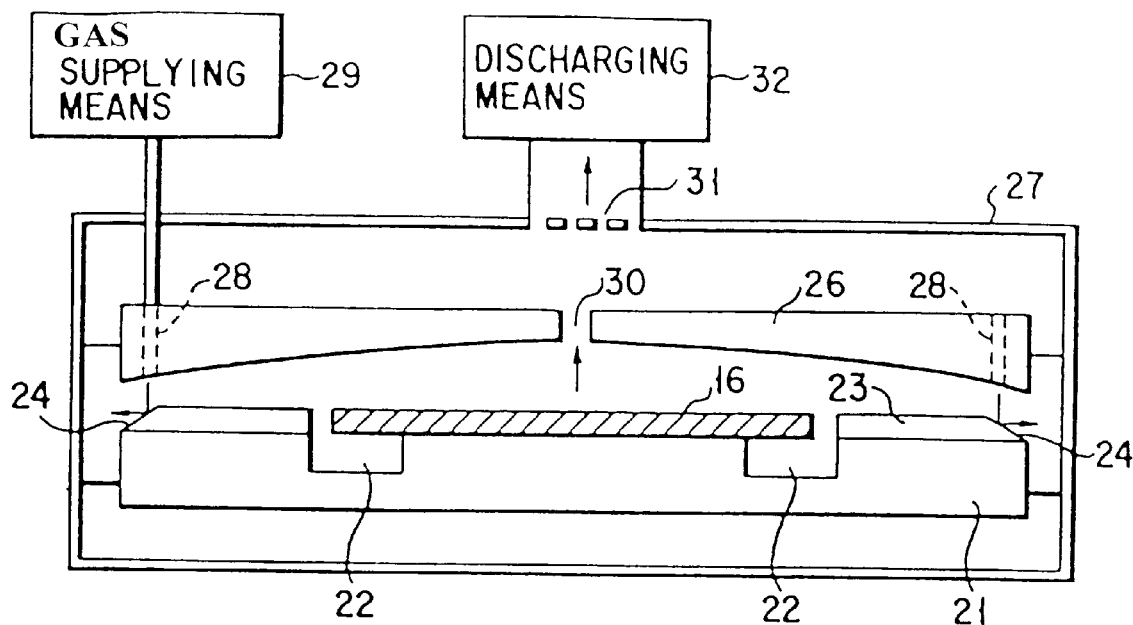
FIG. 3 is a sectional view more specifically illustrating the structure of the baking apparatus according to the first embodiment of the present invention.

The baking chamber section 11 of FIG. 2 has a structure shown in FIG. 3, for performing the heating treatment of the substrate.

In FIG. 3, reference numeral 21 denotes a lower heating plate (a first heating plate). A rectangular photomask substrate 16 on the surface of which is applied with photoresist is located above the lower heating plate 21 so as to be separated from the lower heating plate 21 by a proximity gap of several microns. The lower heating plate 21 is provided with a groove 22 such that a substrate-carrying chuck (not shown) of the carrying section 13 are put therein.

Figure 4:
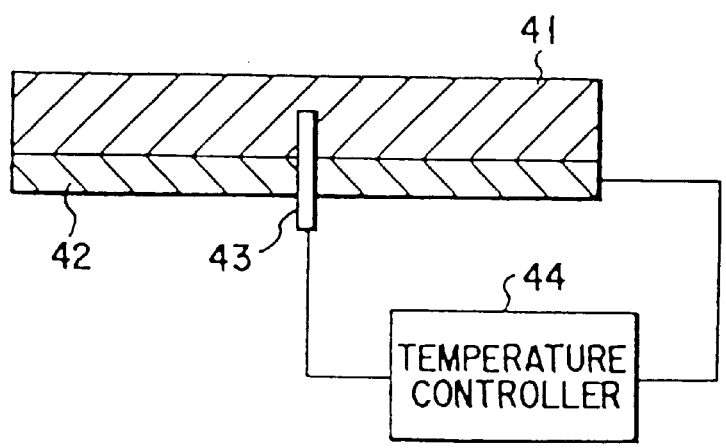
FIG. 4 is a sectional view of a lower heating plate in the baking chamber section shown in FIG. 3.

As shown in FIG. 4, the lower heating plate 21 including a heating plate 41 and a heater 42 as heating means. In the central portion of the heating plate 41, a thermocouple 43 is embedded to adjust the temperature. The heater 42 is controlled on the basis of the output of the temperature controller 44.

FIG. 3 shows a heat unifying ring (heat unifying plate) 23 fixed on the lower heating plate 21 so as to surround the periphery of the photomask substrate 16. The heat unifying ring 23 is formed to have substantially the same thickness as that of the photomask substrate 16. The periphery of the heat unifying ring 23 is provided with a taper section 24 tapered to the periphery at a predetermined angle. The heat unifying ring 23 is further provided with a container 25, as shown in FIG. 5 for containing the photomask substrate 16. The container 25 has a shape corresponding to that of the photomask 16 and a size slightly larger than the photomask substrate 16.

FIG. 3 also shows an upper heating plate (a second heating plate) 26 arranged above the lower heating plate 21. Similarly to the lower heating plate 21, the upper heating plate 26 is also provided with a heating plate and a heater as a heat source. In addition thereto, a thermocouple and a temperature controller are also provided to the upper heating plate 26, for controlling temperature. The upper heating plate 26 is formed to have the smallest thickness at the central portion and to increase the thickness as the distance from the central portion increases. The thickness of the upper heating plate 26 is set in such a manner in order to set the amount of the heat applied to the photomask substrate 16 located on the lower heating plate 21 to be smallest at the central portion and to gradually increase as the distance from the central portion increases.

Above the upper heating plate 26, surface of a baking chamber 27 is provided to cover the entire portion of the baking chamber section 11, thereby the baking chamber section 11 can be shielded from the outside and free from the influence of the outside.

The upper heating plate 26 is further provided with gas inlet holes 28 at the portion located immediately above the taper section 24 on the lower heating plate 21. The gas inlet holes 28 are, as shown in FIG. 6, formed on the substantially entire periphery of the upper heating plate 26 such that inert gas such as nitrogen gas discharged from a gas supplying means 29 shown in FIG. 3 flows through the gas inlet holes 28 at a predetermined rate. By introducing the nitrogen gas flow into the chamber, the screen of the nitrogen gas is formed between the upper heating plate 26 and lower heating plate 21. The nitrogen gas flows onto the taper section 24 formed on the heat unifying ring 23 and diffuses to the outside of the portion in which the photomask substrate 16 is located. A part of the nitrogen gas flows into the portion in which the photomask substrate 16 is located. The photomask substrate 16 is charged when it is exposed to the stream of the nitrogen gas. The temperature of the nitrogen gas is set at the temperature by which the uniformity of the temperature in the substrate is not adversely affected, or higher than the temperature by several degrees. By introducing the nitrogen gas the temperature and the flow rate of which are suitably set in such a manner, the uniformity of the temperature in the substrate can be improved.

Further, as shown in FIGS. 3 and 6, an opening section 30 is provided at the central portion of the upper heating plate 26, and an opening 31 is provided to a portion of the chamber 27 just above the opening section 30. The nitrogen gas is discharged from discharging means through the opening 31 at a predetermined flow rate.

Next, the photolithography process using the chemical amplification electron-beam resist will be described below.

The photolithography process using the chemical amplification electron-beam resist is generally performed in order shown in FIG. 7A. At first, the substrate on the surface of which a chrome film is formed is applied with photoresist, and then cooled to a room temperature. The cooled substrate is subjected to the prebaking step and cooled to a room temperature again, and a pattern is written by means of EB (Electron Beam) writing with an electron beam writing apparatus. Thereafter, the substrate is cooled to a room temperature again to perform the PEB (Post Exposure Baking). After the substrate subjected to the baking step is cooled to room temperature again, the photoresist applied on the substrate is developed, and the selective etching of the chrome film and the removal of the photoresist are followed thereto.

While, the photolithography process using the non-chemical amplification electron-beam resist is performed in order shown in FIG. 7B. The same steps as in the photolithography using the chemical amplification electron-beam resist is also performed in the photolithography process using the non-chemical amplification electron-beam resist till the EB step. In the process using the non-chemical amplification electron-beam resist, the resist is developed after the EB step, and the cooling (to a room temperature), postbaking, and cooling (to a room temperature) are performed, and followed by the selective etching of the chrome film and the removal of the photoresist, as in the process using the chemical amplification electron-beam resist.

When the chemical amplification electron-beam resist is used, the baking apparatus is used in the first baking process comprising the prebaking and cooling and the second baking process comprising the cooling, PEB, and cooling. The baking processes in the process using the chemical amplification electron-beam resist will be more specifically described in the following paragraphs. In the baking processes, a photomask substrate such as a 6 inch mask (a quartz substrate of a size of 152.4×152.4×6.4 [mm]) is subjected to the baking processes, and the supply flow rate of nitrogen gas supplied from the gas inlet holes 28 of the heating plate 26 can be set within a range of 0.5–5.0 l/min, and the discharge flow rate of gas discharged from the opening 31 of the baking chamber 27 can be set within a range of 0.1–3.0 l/min. The cooling section 12 is provided with a cooling plate the temperature of which is set in advance and kept at a room temperature, 23° C., for example.

As a pretreatment of the first baking process, a chemical amplification electron-beam resist is dropped on the photomask substrate 16 from a photoresist applying apparatus, and the substrates is spun such that a photoresist film having a predetermined thickness is formed thereon. Then, an operation command is sent from the control panel 15 to the substrate carrier 14 after a plurality of the substrates 16 are set in the substrate carrier 14. The substrate carrier 14 receiving the command form the control panel carries one of the substrates 16 to the cooling section 12 and the cooling section 12 cools the substrate on the cooling plate by force for a predetermined period of time. Subsequently, in the condition where the supply and discharge flow rates of the gas in the chamber are set at 0.5 l/min and the temperatures of the lower heating plate 21 and the upper heating plate 26 are set at 100° C. and 90° C. respectively, the substrate 16 is located on the lower heating plate 21 in the chamber 27 to be submitted to the prebaking step. The temperatures of the lower and upper heating plates can be adjusted within a range of 60–200° C. In the prebaking step, the substrate 16 is surrounded by the heat unifying ring 23 provided on the lower heating plate 21 such that heat is applied to the side walls of the substrate 16 from the heat unifying ring. By virtue of this structure, the maximum temperature difference between the central portion and the peripheral portion of the substrate 16 can be remarkably decreased.

In addition, the upper heating plate 26 the temperature of which can be adjusted desirably is located above the substrate 16, and the temperature distribution on the substrate can be set even by applying a proper amount of heat to the entire substrate from the above. Further, as shown in the drawing, the upper heating plate 26 is formed to have the smallest thickness at the central portion so as to increase the thickness as the distance from the central portion increases so that the central portion of the substrate is applied with the smallest amount of the heat and the amount of heat applied to the substrate gradually increases as the distance from the central portion increases. The temperature of the peripheral portion remains lowest in the substrate heated only by the lower heating plate 21. By forming the upper heating plate in such a shape, the peripheral portion can be heated higher than the central portion by the upper heating plate, thereby the temperature difference in the substrate can be minimized.

The prebaking step is generally performed to evaporate a part of the solvent contained in the photoresist applied to the substrate and thereby to improve the sensitivity of the photoresist. In addition to this effect, the prebaking step plays an important roll in the uniformity of the size in the resist mask as a final product. By improving the uniformity of the temperature in the substrate during the prebaking step, the uniformity of the size in the resist mask as a final product can be also improved.

After the prebaking step performed for a predetermined period of time (10 minutes, for example), the substrate 16 subjected to the prebaking step is immediately carried to the cooling section 12 to be cooled for a predetermined period of time by force on the cooling plate the temperature of which is maintained at 23° C., a room temperature.

The cooling section 12 used for cooling the substrate 16 is formed as shown in FIG. 9, for example. The substrate 16 is carried by the carrying section 13 on the distal ends of four pins 52a–52d (52c and 52d are not shown in the drawing) of the cooling plate 51. A nozzle 53 of the cooling section 12 is provided with buffer plate 54 and gas guiding plate 55 at the distal end. The buffer plate 54 is fixed to the nozzle 53 by a component through which gas can flow, for example, with a screw 56 a part of the wall of which is cut away. The four pins 52a–52d are fixed on an air cylinder 57.

In the cooling section 12 having such a structure, then the air cylinder 57 is driven to move down the four pins 52a–52d on which the substrate 16 is arranged such that the cooling plate 51 comes close to the substrate 16 till the distance therebetween is reduced, to approximately 0.1 mm. Then, the nozzle 53 on which the buffer plate 54 and gas guiding plate 55 are fixed is moved to position above the substrate 16 by a mechanism not shown.

The pure nitrogen gas is then introduced into the cooling section from the gas inlet 58 of the nozzle 53. The introduced nitrogen gas flows onto the buffer plate 54 and diffuses to the outside of the buffer plate 54. The gas guiding plate 55 and the substrate 16 guide the nitrogen gas to make the gas flow above the substrate even, and the substrate 16 is cooled by the gas flow. In this embodiment, the gas guiding plate 55 is formed larger than the substrate 16 in order to make the gas flow above the substrate 16 even, and the substrate 16 can be evenly cooled.

When the gas is introduced, if the distance between the gas guiding plate 55 and the substrate 16 is set larger than 20 mm, a turbulent flow may be generated and the gas may not flow evenly toward the outer periphery of the gas guiding plate, with the result that the substrate may be cooled unevenly. The distance between the gas guiding plate 55 and the substrate 16 therefore needs to be set less than 20 mm.

The flow rate of the nitrogen gas is also an important factor for the temperature uniformity in the substrate. If the flow rate of the nitrogen gas is small, the cooling of the substrate 16 begins from the periphery, and the temperature difference between the peripheral portion and the central portion will increase, with the result that the large difference in the sensitivity of the photoresist may occur in the substrate. While, if the flow rate of the nitrogen gas is too large, the cooling of the substrate 16 begins from the central portion, and the large difference in the sensitivity of the photoresist in the substrate may also occur. According to the experiment by the inventors, the substrate can be evenly cooled within a range of 2–5° C. of the temperature difference when the flow rate of the nitrogen gas is set within a range of 5–30 l/min.

The second baking process including the cooling, the PEB and the cooling steps indicated in FIG. 7A will be described below. As in the first baking process, the substrate 16 on which the EB writing has finished is carried to the cooling section 12 at first to be cooled on the cooling plate which is set and maintained at 23° C., the room temperature, by force for a predetermined period of time. Subsequently, the substrate 16 is located on the lower heating plate 21 in the chamber 27 to be submitted to the baking step in the condition where the supply and discharge flow rate of the gas in the chamber is set at 0.5 l/min, and the temperatures of the lower heating plate 21 and the upper heating plate 26 are set at 109° C. and 113° C. respectively.

Also in the PEB step, the sidewall of the substrate 16 is applied with heat from the heat unifying ring 23 provided on the lower heating plate 21 to surround the substrate 16, and thus the temperature difference between the central portion and the peripheral portion of the substrate 16 can be remarkably decreased. In addition, the temperature of the upper heating plate 26 which is located further from the substrate 16 in comparing with the lower heating plate 21 is set higher than that of the lower heating plate 21. The entire substrate is heated by the upper heating plate located above the substrate, thereby the temperature distribution on the substrate can be set even.

In the above example, the maximum temperature difference between the lower and upper heating plates is set at 4.0° C. This maximum temperature difference therebetween is desirably set in a range of 0.2–5.0° C., though the temperature difference is influenced by the distance between the lower and upper heating plates. The distance between the lower and upper heating plates is defined in a range of 0.5–10.0 mm in the second baking process.

Further, the upper heating plate 26 is formed to have the smallest thickness at the central portion so as to increase the thickness as the distance from the central portion increases. By forming the upper heating plate, the central portion of the substrate is applied the smallest amount of the heat and the amount of heat applied to the substrate gradually increases as the distance from the central portion increases. The temperature of the peripheral portion remains lowest in the substrate heated only by the lower heating plate 21. By forming the upper heating plate in such a shape, the peripheral portion can be heated higher then the central portion by the upper heating plate, thereby the temperature difference in the substrate can be minimized.

According to the experiment by the inventors, the maximum temperature difference in the substrate 16 is 3.0° C. before the temperature in the baking chamber reaches the predetermined baking temperature and still remains at 60° C. This value is considerably lower than the maximum temperature difference 29.0° C. when the conventional apparatus is used.

FIG. 8 is a graph showing the average temperature and the maximum temperature difference in the substrate when the substrate is heated in the PEB process, which is prepared in order to compare the apparatus of the present invention and the conventional apparatus. As shown in the graph, at the time when 60 seconds have passed from the beginning of the baking, the maximum temperature difference in the substrate is 4.0° C. in the present invention, while that of the conventional apparatus is 25.0° C. At the stabilizing time when 400 seconds have passed from the beginning of the baking, the maximum temperature difference in the substrate when the conventional apparatus is used is 8.0° C. While, the present invention attain the maximum temperature difference of 0.2° C.

As shown in the above embodiment, the present invention considerably improves the temperature uniformity in the substrate in comparing with the conventional apparatus.

The PEB step is an important step for the chemical amplification electron-beam resist since the difference in size in the resist mask significantly depends thereon. During the PEB step the substrate is easily influenced by the temperature difference of the heating plate and the environment around the baking apparatus.

After the PEB step performed for 8 minutes, the substrate 16 is immediately carried to the cooling section 12 to be cooled on the cooling plate which is set and maintained at 23° C., the room temperature, by force for a predetermined period of time. According to the experiment by the inventors, the maximum temperature difference in the substrate 16 is 4.5° C. during the cooling step. This is quite lower than that of the conventional apparatus.

The postbaking step indicated in FIG. 7A when the non-chemical amplification electron-beam resist is used will be described below. After the photoresist is developed, the substrate is carried to the cooling section 12 to be cooled on the cooling plate which is set and maintained at 23° C., the room temperature, by force for a predetermined period of time. Subsequently, in the condition where the supply and discharge flow rate of the gas in the chamber is set at 0.5 l/min and the temperatures of the lower heating plate 21 and the upper heating plate 26 are set both at 90° C., the substrate 16 is located on the lower heating plate 21 in the chamber 27 to be submitted to the postbaking step for a predetermined period of time, 10 minutes, for example. The postbaking step is intended to evaporate the developing solution by heating the resist pattern which is expanded by the developing solution, and thereby to shrink the pattern. The evenness of the size in the resist pattern as a final product can be improved also in this step. After the postbaking step has finished, the substrate is immediately carried to the cooling section 12 to be cooled on the cooling plate which is set and maintained at 23° C., the room temperature, by force for a predetermined period of time.

The following is the description of the various modifications of the substrate baking apparatus described in the above embodiment. In the above embodiment, the upper heating plate 26 has the smallest thickness at the central portion, as shown in FIG. 3, so as to increase the thickness as the distance from the central portion increases so that the central portion of the substrate is applied the smallest amount of the heat and the amount of heat applied to the substrate gradually increases as the distance from the central portion increases. The upper heating plate 26, however, can be formed in any shape or structure, if the heating plate has the same function.

FIG. 10A shows the upper heating plate 26 having the smallest thickness at the central portion such that the thickness of the heating plate stepwisely increases as the distance from the central portion increases.

FIG. 10B shows the upper heating plate 26 having the same thickness at any portion. The upper heating plate 26 of FIG. 10B is bent at the central portion such that the central portion is the highest in the heating plate and furthest from the lower heating plate. The distance to the lower heating plate gradually increase as the distance from the central portion increases.

FIG. 10C shows the upper heating plate 26 having a hole 61 in the central portion.

FIG. 10D shows the upper heating plate 26 formed so that the central portion of the substrate is applied with the smallest amount of the heat and the amount of heat applied to the substrate gradually increases as the distance from the central portion increases, by adjusting the heat supplied from the heater 42 not shown in this drawing.

Figure 11:
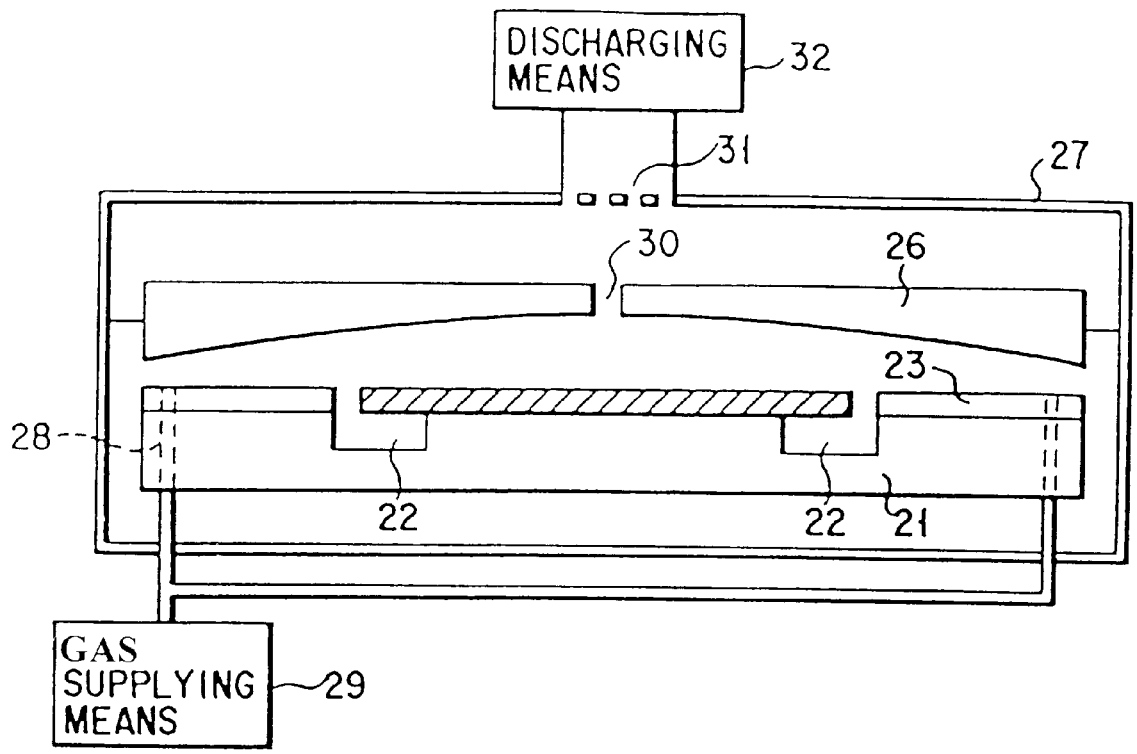
FIG. 11 is a sectional view of the modification of the baking chamber section of the baking apparatus shown in FIG. 2.

According to the above-described embodiment, the upper heating plate 26 is provided with the gas inlet holes 28 to introduce the nitrogen gas and form the screen of the nitrogen gas between the upper and lower heating plates. The gas inlet holes 28 may be formed in the lower heating plate 21 as shown in FIG. 11, to introduce the nitrogen gas by the gas supplying means 29 therefrom and form the nitrogen gas screen.

Figure 12:
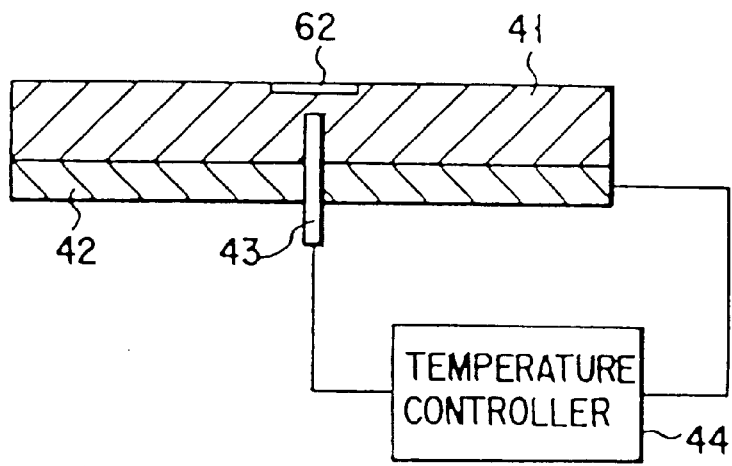
FIG. 12 is a sectional view of the modification of the lower heating plate.

In the above embodiment, the structure of the upper surface of the lower heating plate 21 on which the photomask substrate 16 is located is not specifically described. In the lower heating plate, the central portion of the surface of the heating plate 41 forming the lower heating plate 21 may be provided with a round depression, as shown in FIG. 12. By virtue of this depression, the temperature of the central portion of the substrate located on the lower heating plate can be decreased when the substrate is subjected to the baking step. The temperature of the central portion of the substrate depends on the diameter and depth of the depression 62. When the 6 inch mask is subjected to the baking step and the diameter of the depression is 50 mm and the depth of the depression is 0.2 mm, the temperature of the central portion of the substrate is lower by 0.5° C. than the average temperature of the surface of the substrate. As is clear from this, the temperature difference can be remarkably reduced by providing this depression on the central portion.

The following is the description of the second embodiment of the baking apparatus of the present invention.

The baking chamber section 11 shown in FIG. 13 has a driving mechanism for driving the upper heating plate 26 in upper and lower directions. More specifically, the baking chamber section 11 of the second embodiment, unlike the baking chamber shown in FIG. 3, provided with the driving mechanism comprising arm 63 fixing the upper heating plate 26, ball screw 64 and motor 65, and drives the upper heating plate 26 in upper and lower direction by moving up and down an arm 63 fixing the upper heating plate 26.

In the baking chamber section 11 of the second embodiment, the upper heating plate 26 is moved up before the photomask substrate 16 is located on the lower heating plate 21, in order to easily locate the photomask substrate 16 on the lower heating plate 21, and when the substrate is subjected to the baking step, the upper heating plate 26 is moved down to approach the lower heating plate 21.

It is necessary for the improvement of the temperature uniformity in the surface of the substrate to increase the baking chamber at a predetermined temperature as soon as possible after the photomask substrate 16 is located on the lower heating plate 21. However, if the moving velocity of the upper heating plate 26 increases too much, dust may be raised and sucked up by the upper heating plate 26. The sucked dust may stick to the surface of the photomask substrate 16 and may be subjected to the baking step on the substrate.

In order to prevent the stick of dust to the substrate during the moving-down of the upper heating plate 26, the rotating speed of the driving motor 65 by which the moving velocity of the upper heating plate is defined is controlled such that the moving velocity V of the upper heating plate 26 is gradually decreased after the distance T between the upper and lower heating plates is decreased less than a predetermined distance $T_0$ (5 mm, for example), as shown in FIG. 14A. By controlling the driving motor 65 in such a manner, the stick of dust to the photomask substrate can be prevented.

After the substrate is subjected to the baking step, the upper heating plate 26 is moved up to remove the photomask substrate 16 located on the lower heating plate 21. In this time, the rotating speed of the driving motor 65 is controlled such that the moving velocity V of the upper heating plate 26 is gradually increased till the distance T between the upper and lower heating plates reaches the predetermined value $T_0$ (5 mm, for example), as shown in FIG. 14B. After the distance T increases more than the predetermined distance $T_0$, the moving velocity V of the upper heating plate 26 is maintained at a constant high level at which high baking throughput can be attained.

The photomask substrate 16 is raised away from the upper heating plate 26 after the movement of the upper heating plate 26, as mentioned above. When the photomask substrate 16 is raised, air may flow into the region under the photomask substrate 16, charging the photomask substrate 16. In order to prevent the photomask substrate 16 from being charged, it is raised in such a manner that the raising speed gradually increases at first and is then kept high.

As described above, when the upper heating plate 26 is located near the lower heating plate 21, the stick of dust to the photomask substrate 16 can be prevented by decreasing the moving velocity V of the upper heating plate 26.

In addition, according to this embodiment, the distance between the upper heating plate 26 and lower heating plate 21 can be desirably adjusted, and thus the distance can be set at an optimum level in accordance with the thickness of the photomask substrate 16.

The third embodiment will be described below.

The environment in which the photomask substrate is located when the photoresist subjected to the baking step by using the baking apparatus is quite dry. Therefore, when the baking step has finished and the photomask substrate 16 is taken out, static electricity may be generated on the surface of the photomask substrate 16, and dust may be easily stick to the substrate.

Figure 15:
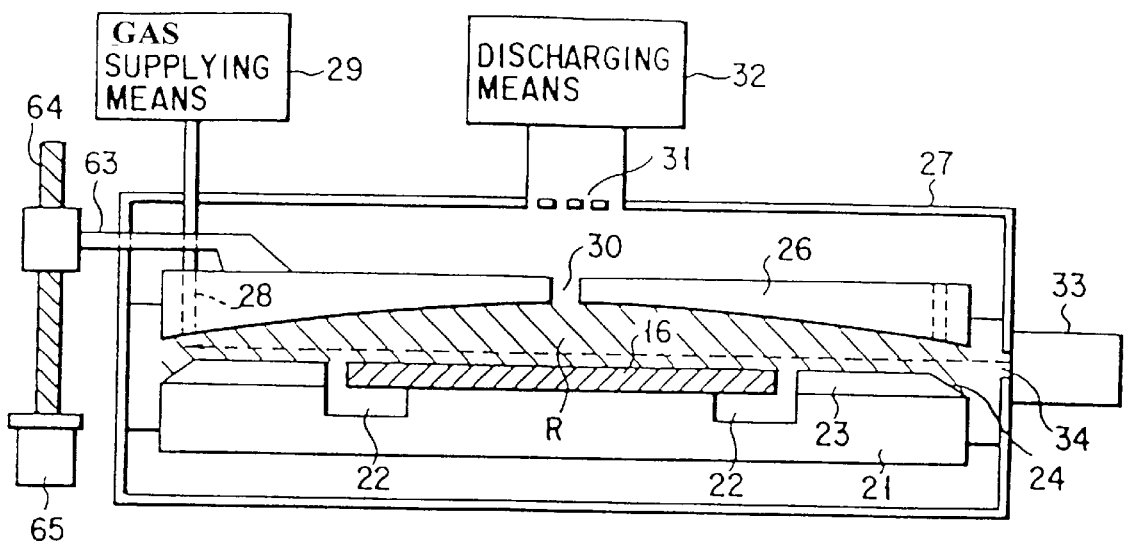
FIG. 15 is a sectional view specifically illustrating the structure of the baking chamber section according to the third embodiment.

In order to prevent the stick of dust, the baking chamber section 11 according to this embodiment is formed to have the baking chamber section 11 as shown in FIG. 13 an ionizer such as a soft X-ray ionizer (soft X-ray generator) 33, as shown in FIG. 15. In the baking chamber section 11 of this embodiment, like reference numerals are used to designate like portions corresponding to those of the apparatus of FIG. 13 throughout the drawings, for simplicity of illustration.

The soft X-ray ionizer 33 is arranged on the outer side wall of the baking chamber 27 so as to emit the soft X-ray beam into the baking chamber through a window 34 formed on the side wall of the baking chamber 27. By providing the soft X-ray ionizer 33 with the baking chamber in such a manner, the soft X-ray beam travels through a passage between the lower heating plate and upper heating plate in the lateral direction, and the molecules in the atmosphere between the lower heating plate and upper heating plate (i.e., the atmosphere indicated by the oblique lines in the drawings) are ionized.

The soft X-ray ionizer 33 is controlled to operate when the baking has finished and the upper heating plate is moved up, for example. The soft X-ray ionizer 33 generates ions and the ions are positioned on the surface of the photomask substrate 16. The ions will neutralize the static electricity exist on the surface of the photomask substrate 16 when the upper heating plate is moved, and dust may not be stick to the substrate. Since, as described above, the photomask substrate 16 may be charged when it is raised away from the upper heating plate 26 at the end of baking, the soft X-ray ionizer 33 can be actuated then. By so doing, the photomask substrate 16 is prevented from being charged.

In the above-mentioned embodiment, the soft X-ray ionizer 33 is arranged on the baking chamber provided with the driving mechanism for moving up/down the upper heating plate 26. The soft X-ray ionizer 33, however, may be arranged on the baking chamber as shown in FIGS. 3 and 11 on which is not provided with the driving mechanism. Further, any other beam may be used instead of the soft X-ray beam if the beam can ionize the molecules in the atmosphere without disturbing the gas in the chamber. In these cases as well, the photomask substrate 16 can be prevented from being charged by actuating the ionizer when the photomask substrate 16 is raised away from the upper heating plate 26 at the end of baking.

In the described embodiments and the modifications, the photomask substrate is submitted to the baking process. It is further understood by those skilled in the art that the present invention may be also applied to not only a semiconductor substrate such as silicon substrate and sapphire substrate, but also a substrate of the liquid crystal display.

In addition, though the substrate is repeatedly cooled before and after the baking step in the described embodiments, the cooling steps can be omitted as the case may be. Similarly, in the embodiments, the electron beam writing apparatus is used to write the pattern in the photoresist, but the pattern writing using UV light or X-ray beam can be performed throughout the baking process.

Figure 16:
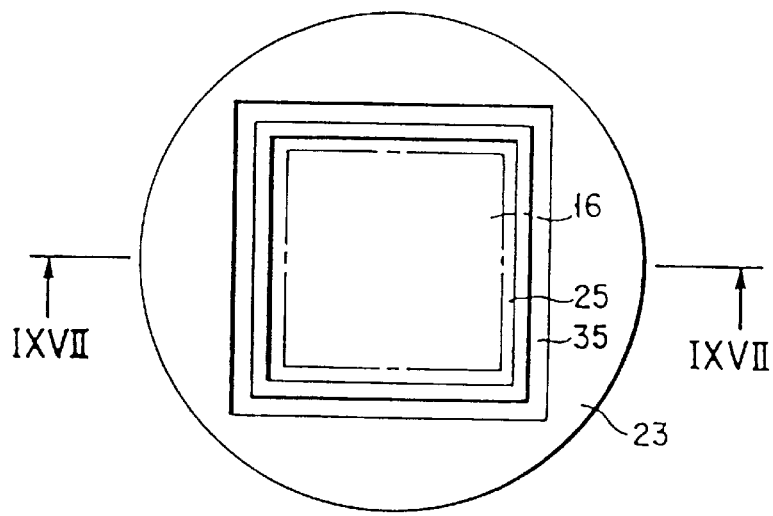
FIG. 16 is a plain view of the heat unifying ring according to a modification of the present invention.
Figure 17:
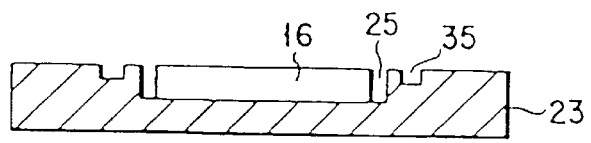
FIG. 17 is a sectional view of the heat unifying ring shown in FIG. 16 taken along a line IXVII—IXVII.

Further, not only the device having a structure shown in FIG. 5, but also the device having a structure shown in FIGS. 16 and 17 can be used as the heat unifying ring 23 fixed on the lower heating plate 21.

FIGS. 16 and 17 are plain view and sectional view of the heat unifying ring 23. The heat unifying ring 23 shown in FIGS. 16 and 17, similarly to the device shown in FIG. 5, has a container 25 for containing the photomask substrate 16 and a taper section 24 (not shown in FIG. 17) formed on the periphery thereof. In the heat unifying ring 23 shown in FIGS. 16 and 17, groove 35 for guiding fluid is formed along the periphery of the container 25.

The gas set at a predetermined temperature is supplied through the groove when the heat unifying ring 23 is used for the baking process, thereby the temperature uniformity on the photomask substrate 16 can be improved. Further, when ionized gas is supplied, through the groove, the static electricity can be prevented from generating, with the result that the substrate can be protected from dust.

The groove similarly to the groove 35 can be also formed on the upper heating plate 26.

As described above, the present invention can provide an apparatus and method of baking photoresist applied on the surface of a substrate, which can improve the temperature uniformity in the surface of the substrate submitted to the baking process.

What is claimed is:

1. A method of baking photoresist applied on a surface of a substrate, comprising the steps of:

unifying a temperature of said substrate by arranging said substrate on a cooling, plate for a predetermined period of time before said photoresist is baked;

baking said substrate in a container, wherein said substrate is located with respect to a first heating plate by a distance ranging from direct contact with the first heating plate to within several microns of the first heating plate, a heat unifying plate being mounted on said first heating plate in such a manner as to surround a periphery of said substrate, wherein said heat unifying plate has substantially the same thickness as that of the substrate, and a second heating plate being arranged above said surface of said substrate.

2. A method of baking photoresist applied on a surface of a substrate, comprising the steps of:

unifying a temperature of said substrate by cooling said substrate before said photoresist is baked;

baking said substrate in a container, wherein said substrate is located with respect to a first heating plate by a distance ranging from direct contact with the first heating plate to within several microns of the first heating plate, a heat unifying plate being mounted on said first heating plate in such a manner as to surround a periphery of said substrate, wherein said heat unifying plate has substantially the same thickness as that of the substrate, and a second heating plate being arranged above said surface of said substrate; and cooling said substrate on a cooling plate by discharging cooling gas from said above of said substrate.

3. A method of baking photoresist applied on a surface of a substrate, comprising the steps of:

arranging said substrate, in advance of baking the photoresist, at a distance from a first heating plate ranging from direct contact with the first heating plate to within several microns of the first heating plate, and mounting a heat unifying plate which has substantially the same thickness as that of said substrate on said first heating plate in such a manner as to surround a periphery of said substrate;

arranging a second heating plate above said first heating plate;

baking said substrate in a container in which said second heating plate is moved to approach said first heating plate; and moving said second heating plate in a direction away from said first heating plate after said photoresist is baked.

4. A method according to claim 3, wherein when said second heating plate is moved in a direction in which said second heating plate approaches said first heating plate, and after the distance between said second heating plate and said first heating plate is less than a predetermined value, said second heating plate is gradually decelerated as said second heating plate approaches said first heating plate, and when said second heating plate is moved in a direction in which said second heating plate leaves from said first heating plate, said second heating plate is gradually accelerated till the distance between said second heating plate and said first heating plate reaches a predetermined value.

5. A method according to any one of claims 1–3, wherein said photoresist is baked such that a temperature of said second heating plate is higher than that of said first heating plate.

6. A method according to claim 5, wherein said photoresist is baked such that a temperature difference between said first and second heating plates is defined within a range of 0.2–5.0°C.

7. A method according to any one of claims 1–3, wherein said photoresist is a chemical amplification electron-beam resist.

8. A method according to any one of claims 1–3, wherein said photoresist is baked such that an amount of heat applied to said substrate gradually increases as a distance from a central portion of said substrate increases and a distance from a peripheral portion of said substrate decreases.

9. A method according to any one of claims 1–3, wherein said second heating plate is provided with gas inlet holes formed on said peripheral portion in order to supply gas at a predetermined flow rate from said gas inlet holes toward said first heating plate, and said photoresist on said substrate surrounded by said first and second heating plates and a gas screen formed by a gas flow supplied from said gas inlet holes is baked.

10. A method according to claim 9, wherein said container is provided with a gas discharging opening through which said gas is discharged at a predetermined flow rate.

11. A method according to any one of claims 1–3, wherein the atmosphere at least above said first heating plate is ionized by irradiating a gap between said first and second heating plates when said photoresist is baked.

12. A method according to claim 11, wherein a soft X-ray is used for irradiating said gap.

13. A method according to any one of claims 1–3, wherein said heat unifying plate has a container section for containing said substrate and a groove formed along a periphery of said container section, and fluid is supplied in said groove.

14. A substrate baking method according to claim 13, wherein said fluid is ionized gas.

* * * * *

UNITED STATES PATENT AND TRADEMARK OFFICE
CERTIFICATE OF CORRECTION

PATENT NO. : 6,051,371
DATED : April 18, 2000
INVENTOR(S) : Katsuhisa MITA et al.

It is certified that error appears in the above-identified patent and that said Letters Patent is hereby corrected as shown below:

Claim 1, Column 13, line 34, after "cooling", delete ","

Claim 1, Column 13, lines 42-43, "unifving" should read --unifying--.

Signed and Sealed this

Twenty-second Day of May, 2001

*Attest:*

NICHOLAS P. GODICI

*Attesting Officer*     Acting Director of the United States Patent and Trademark Office